United States Patent [19]

Williams

[11] Patent Number: 4,709,172

[45] Date of Patent: Nov. 24, 1987

[54] INPUT-VOLTAGE DETECTOR CIRCUIT FOR CMOS INTEGRATED CIRCUIT

[75] Inventor: Clark R. Williams, Plano, Tex.

[73] Assignee: Dallas Semiconductor Corporation, Dallas, Tex.

[21] Appl. No.: 766,954

[22] Filed: Aug. 19, 1985

[51] Int. Cl.[4] .................... H03K 5/153; H03K 17/30; H03K 17/284; G11C 8/00

[52] U.S. Cl. .................................. 307/585; 307/451; 307/350; 307/356; 307/576; 307/594

[58] Field of Search ............... 307/450, 451, 584, 585, 307/577, 579, 592, 594, 597, 605, 296 R, 362, 530, 350, 356

[56] References Cited

U.S. PATENT DOCUMENTS

| | | | |
|---|---|---|---|
| 3,969,633 | 7/1976 | Paluck et al. | 307/473 |
| 4,064,405 | 12/1977 | Cricchi et al. | 307/475 X |
| 4,140,930 | 2/1979 | Tanaka | 307/585 X |
| 4,418,291 | 11/1983 | Watson, Jr. | 307/450 X |
| 4,418,292 | 11/1983 | Cserhalmi et al. | 307/450 X |
| 4,453,094 | 6/1984 | Peil et al. | 307/579 X |
| 4,658,156 | 4/1987 | Hashimoto | 307/350 |

FOREIGN PATENT DOCUMENTS 0076925  5/1982  Japan .................... 307/597

*Primary Examiner*—Stanley D. Miller
*Assistant Examiner*—David R. Bertelson
*Attorney, Agent, or Firm*—Leonard & Lott

[57] ABSTRACT

An input-voltage detector circuit for increasing the functionality of a CMOS integrated circuit without requiring an increase in the number of pins or terminals of the integrated circuit includes an N-channel enhancement-mode transistor having its source terminal and substrate region electrically connected to the input of the circuit. A ground-voltage potential is applied to the gate terminal of the N-channel enhancement-mode transistor and a load element is connected between the drain terminal of the N-channel enhancement-mode transistor and the positive-voltage power supply node of the circuit. The drain terminal of the N-channel enhancement-mode transistor is further connected to a buffer stage which provides the output of the circuit. The input-voltage detector circuit detects when a voltage more negative than ground by a predetermined level is applied to the input of the detector circuit. Thus, a circuit is provided which detects the application of an unusual voltage condition at its input; the output of the circuit can be utilized by other on-chip logic to cause the integrated circuit to function differently than under usual conditions.

11 Claims, 3 Drawing Figures

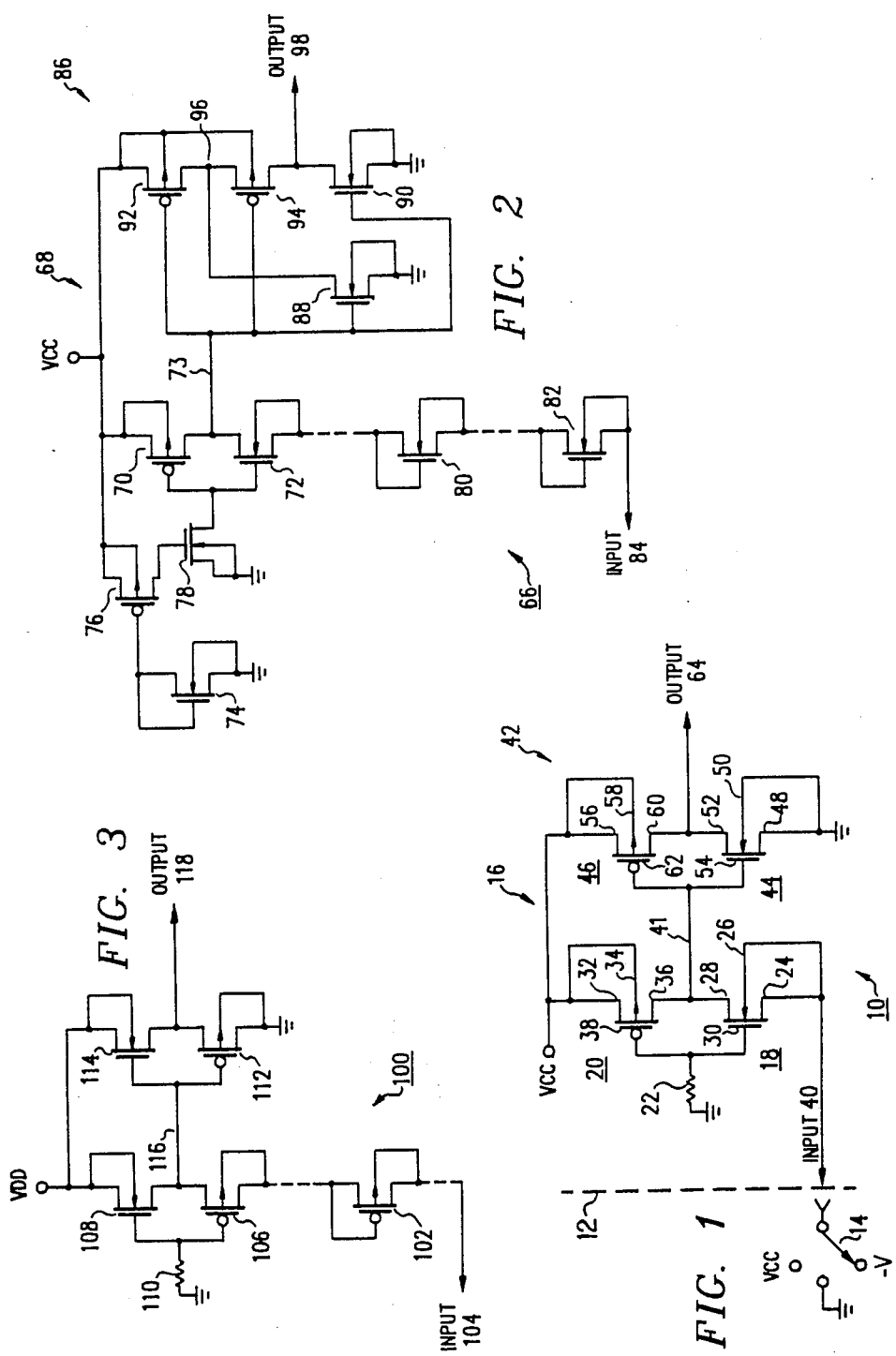

INPUT-VOLTAGE DETECTOR CIRCUIT FOR CMOS INTEGRATED CIRCUIT

TECHNICAL FIELD

The present invention generally relates to integrated logic circuits and, more particularly, is concerned with an input-voltage detector circuit for a CMOS integrated circuit.

BACKGROUND OF THE INVENTION

A CMOS integrated circuit is a type of MOSFET integrated circuit which has both N-channel and P-channel transistors embodied therein. It is frequently desirable to increase the functionality of such an integrated circuit without increasing the number of its external pins or terminals.

In the past, various circuits and schemes have been devised for CMOS integrated circuits and for single-polarity MOSFET integrated circuits to minimize the required number of external terminals. One commonly-used scheme is the sharing of an external terminal as an input and output.

Another approach for minimizing the number of pins is use of a trinary input circuit at an input terminal. The trinary input circuit has two outputs and produces different logic states depending upon whether the input terminal has a logic 1 applied, a logic 0 applied, or is left floating. In CMOS integrated circuits, however, it is frequently undesirable to leave an input floating.

Another scheme, which may be used advantageously in single-polarity MOSFET integrated circuits, utilizes circuitry on the integrated circuit for detecting when a voltage substantially greater than the power supply voltage is applied to an input terminal. The detection of the application of such an unusual voltage condition can be utilized by on-chip logic to cause the integrated circuit to function differently than under usual conditions. This can be especially useful for testing purposes.

Such a high-input-voltage scheme can be implemented by connecting an input terminal not only to the inputs of conventional logic gates on the integrated circuit but also to the gate electrode of an on-chip enhancement-mode MOSFET transistor having an exceptionally high threshold voltage. The threshold voltage of the transistor is made somewhat higher than the power supply voltage in order for the transistor to remain non-conductive when a normal logic 1 or logic 0 is applied to the input, but to become conductive when a voltage substantially greater than that of the power supply is applied. Other on-chip circuitry can readily determine that the high-threshold-voltage transistor has become conductive, thereby detecting that a higher than usual voltage condition is applied to the input terminal. Alternative circuits for detecting the application of a higher than usual voltage at an input include circuits which utilize simple resistive voltage dividers in conjunction with normal-threshold-voltage MOSFET transistors and circuits which utilize series-connected stacks of normal-threshold-voltage MOSFET transistors.

In the usual CMOS integrated circuit case, though, the application of an exceptionally high voltage to an input is impracticable because there usually is an on-chip diode connected between the input and the integrated circuit's power supply node. The diode may be connected by design as part of an electrostatic discharge protection scheme or may exist simply as a consequence of the physical structure of the integrated circuit. A commonly-used CMOS integrated circuit structure, for example, utilizes an N-type substrate in which the sources and drains of all the P-channel transistors are disposed. In such a structure, the source and drain regions of the N-channel transistors are disposed in either common or separate P-wells which, in turn, are disposed in the N-type substrate. These P-wells comprise the P-type substrate regions for the N-channel transistors. In conventional circuitry, the P-wells are connected to a ground potential and the N-type substrate is connected to the most positive power supply node in order that the diodes formed by the P-wells and the N-type substrate is always back-biased. When an input terminal is connected to a P region disposed in the N-type substrate, the forward-bias voltage-clamping action of the diode formed between such a P region and the N-type substrate prevents the input voltage from being taken to a voltage substantially more positive than that which is applied to the N-type substrate.

In accordance with the foregoing, a need exists for a simple input circuit which can be practicably used with CMOS integrated circuits to increase functionality of the integrated circuit without necessitating an increase in the number of external pins or terminals.

SUMMARY OF THE INVENTION

The present invention provides a circuit which may be embodied in a CMOS integrated circuit for detecting the presence of an unusual voltage condition being applied to an external pin or terminal of the integrated circuit. This voltage detection function of the invention may advantageously be utilized to determine the functions that the on-chip logic will perform. Thus, in a manner similar to a trinary input circuit, the present invention may be utilized to increase functionality of an integrated circuit without requiring an increase in the number of pins or terminals of the integrated circuit, or, alternatively, for a given level of functionality, the number of required pins or terminals may be reduced.

The input-voltage detector circuit of the present invention has an input node, an output node, a ground node, and a positive-voltage power supply node. The circuit includes an N-channel enhancement-mode transistor having its source terminal and substrate region electrically connected to the input node; a load element connected between the drain terminal of the N-channel enhancement-mode transistor and the positive-voltage power supply node; a ground-voltage potential applied to the gate terminal of the N-channel enhancement-mode transistor; and an inverter or other suitable buffer circuit having its input connected to the drain terminal of the N-channel enhancement-mode transistor and its output connected to the output node of the detector circuit.

The input-voltage detector circuit detects when a voltage more negative than ground by a predetermined level is applied to the input node of the detector circuit. The predetermined negative voltage level is approximately equal to the threshold voltage of the N-channel enhancement-mode transistor.

In an alternative embodiment, additional N-channel enhancement-mode transistors may be connected in series at the input of the detector circuit to make the predetermined negative voltage level be even more negative. Each additional N-channel enhancement-mode transistor increases the magnitude of the predetermined level by approximately an additional N-channel threshold voltage.

Additional embodiments of the present circuit include complementary circuits obtained by interchanging P-channel transistors and N-channel transistors. For such embodiments, voltage polarities are reversed.

As should be apparent from the foregoing summary, it is a general object of the present invention to provide a novel input-voltage detector circuit for use in a CMOS integrated circuit.

Other objects and advantages, and a more complete understanding of the invention may be obtained by referring to the following detailed description of a preferred embodiment when taken in conjunction with the accompanying drawings.

BRIEF DESCRIPTION OF THE DRAWINGS

FIG. 1 is an electrical schematic illustrating an input-voltage detector circuit in accordance with one embodiment of the invention.

FIG. 2 is an electrical schematic illustrating an alternative embodiment of the input-voltage detector circuit.

FIG. 3 is an electrical schematic illustrating an input-voltage detector circuit which is a complementary embodiment of the circuit of FIG. 1.

DETAILED DESCRIPTION OF A PREFERRED EMBODIMENT

Referring to FIG. 1, an embodiment of an input-voltage detector circuit according to the invention is indicated generally by the reference numeral 10. The input-voltage detector circuit 10 is preferably fabricated using conventional CMOS integrated circuit process technology to produce both N-channel and P-channel enhancement-mode MOSFET transistor in a monolithic integrated circuit. The portion of FIG. 1 to the left of the dotted line 12 is external to the CMOS integrated circuit and includes a switch 14 which normally is switched either to VCC for a logic 1 input or to a ground-voltage potential for a logic 0 input, but which may also be switched to a voltage more negative than ground by a predetermined level.

An input stage 16 is comprised of an N-channel transistor 18, a P-channel transistor 20, and a resistor 22. The N-channel transistor 18 has a source 24, a P-type substrate region 26, a drain 28, and a gate electrode 30. The N-channel transistor 18 is an enhancement-mode device having a threshold voltage to become conductive of approximately 1.0 volt. The P-channel transistor 20 has a source 32, an N-type substrate region 34, a drain 36, and a gate electrode 38. The P-channel transistor 20 is preferably an enhancement-mode transistor having a threshold voltage of approximately 1.0 volt; it can, however, be a depletion-mode transistor.

The source 24 and the P-type substrate region 26 of the N-channel transistor 18 are connected together and to an input node 40. The drain 28 of the N-channel transistor 18 and the drain 36 of the P-channel transistor 20 are connected together and to a node 41. The source 32 and the N-type substrate region 34 of the P-channel transistor 20 are connected together and to a positive-voltage power supply node designated herein as VCC. The gate electrode 30 of the N-channel transistor 18 and the gate electrode 38 of the P-channel transistor 20 are connected together and to one end of the resistor 22. The other end of the resistor 22 is connected to ground.

A buffer stage 42 is comprised of an N-channel transistor 44 and a P-channel transistor 46. The N-channel transistor 44 and the P-channel transistor 46 are enhancement-mode transistors each having a threshold voltage of approximately 1.0 volt. The N-channel transistor 44 has a source 48, a P-type substrate region 50, a drain 52, and a gate electrode 54. The P-channel transistor 46 has a source 56, an N-type substrate region 58, a drain 60, and a gate electrode 62.

The N-channel transistor 44 and the P-channel transistor 46 are connected together in the manner of a conventional CMOS inverter; that is, the source 48 and the P-type substrate region 50 of the N-channel transistor 44 are connected together and to ground, the source 56 and the N-type substrate region 58 of the P-channel transistor 46 are connected together and to VCC, the gate electrode 54 is connected to the gate electrode 62, and the drain 52 is connected to the drain 60. The gate electrode 54 and the gate electrode 62 comprise the input of the buffer stage 42 and are connected to the node 41 which comprises the output of the input stage 16. The drain 52 and the drain 60 comprise the output of the buffer stage 42 and are connected to an output node 64.

In the preferred embodiment, VCC is typically five volts positive with respect to ground. A ground-voltage potential is applied to the gate electrode 30 and the gate electrode 38 through the resistor 22. The resistor 22 serves to help protect the N-channel transistor 18 and the P-channel transistor 20 from damage due to electrostatic discharge which might occur as the result of physical handling of the integrated circuit. If careful handling precautions are observed, the resistor 22 can be replaced with a direct electrical connection to ground. Other alternatives for the resistor 22 include its replacement with some other type of conductive path to ground; a transistor biased to be conductive, for example, is a suitable replacement.

Whenever the input node 40 is at VCC or ground or any voltage between VCC and ground, the N-channel transistor 18 is in a non-conductive state; the P-channel transistor 20, though, is in a conductive state. As a result, the voltage on the node 41, is at VCC. Under these circumstances, the N-channel transistor 44 is in a conductive state and the P-channel transistor 46 is in a non-conductive state; consequently, the output node 64 is at a voltage at or close to ground.

When a voltage more negative than the magnitude of the threshold voltage of the N-channel transistor 18 is applied to the input node 40, the N-channel transistor 18 changes to a conductive state. The width/length ratio of the N-channel transistor 18 is selected to be much greater than that of the P-channel transistor 20. In the preferred embodiment the width/length ratio of the N-channel transistor 18 is 10/10 and that of the P-channel transistor 20 is 4/500. With these device sizes the voltage at the node 41 will transition from VCC to a voltage near or more negative than ground when the N-channel transistor 18 becomes conductive. The output node 64 consequently transitions from ground (a logic 0) to VCC (a logic 1), thereby indicating that an unusual voltage condition—the application of a voltage more negative than a predetermined value—being applied to the input node 40.

An integrated circuit with which the present invention may advantageously be used is described in a copending patent application entitled Space-Saving Back-Up Power Supply, Ser. No. 660,937 filed Oct. 15, 1984, in the names of Smith, Jr., et al. The '937 Application discloses and claims a module for providing battery back-up to a separately packaged electronic circuit such as a large scale integrated circuit memory. The module described in the '937 Application includes a CMOS integrated circuit which has a normal power supply terminal, a ground terminal, and two terminals for connection to two batteries for back-up power. In a power-down mode, the CMOS integrated circuit normally automatically selects as a source of energy whichever battery has the highest voltage. The voltage of the selected battery is supplied both to the internal logic of the CMOS integrated circuit and to an output terminal of the CMOS integrated circuit for providing standby power to the separately packaged electronic circuit. The module is physically configured in such a manner that directly contacting the standby batteries for testing the voltage of the batteries is not feasible; the standby power output terminal of the CMOS integrated circuit, however, can readily be contacted. In order to test the voltage of the lowest-voltage battery, a scheme is needed whereby, without adding an extra pin, the voltage of the lowest-voltage battery can be selected to be applied to the standby power output terminal rather than that of the highest-voltage battery. The input-voltage detector circuit of the present invention provides the circuitry needed to cause other logic of the CMOS integrated circuit to select the lowest-voltage battery without necessitating an increase in the number of external terminals. In the module described in the '937 Application the terminal connected to the input of the input-voltage detector circuit is therein designated as VCCI. The VCCI terminal is the normal power supply input terminal of the module but its usual function is unneeded for a test of the lowest-voltage battery.

Referring to FIG. 2, an alternative embodiment of the input-voltage detector circuit according to the present invention is indicated generally by the reference numeral 66. Each of the transistors of the circuit 66 is preferably an enhancement-mode transistor having a threshold voltage of approximately 1.0 volt. An input stage 68 is comprised of a P-channel transistor 70, an N-channel transistor 72, an N-channel transistor 74, a P-channel transistor 76, and N-channel transistor 78, and series-connected N-channel transistors 80 and 82.

The source and N-type substrate region of the P-channel transistor 70 are connected together and to VCC. The drain terminal of the P-channel transistor 70 and the drain terminal of the N-channel transistor 72 are connected together and to a node 73 which provides the output of the input stage 68. The gate electrode of the P-channel transistor 70 is connected to the gate electrode of the N-channel transistor 72 and to the drain of the N-channel transistor 78. The P-channel transistor 70 and the N-channel transistor 72 function substantially in the same manner as the P-channel transistor 20 and the N-channel transistor 18 of the embodiment of FIG. 1. The resistor 22 of FIG. 1, however, is replaced by the combination of the N-channel transistor 74, the P-channel transistor 76, and the N-channel transistor 78.

The source and the P-type substrate region of the N-channel transistor 74 are connected together and to ground while the gate electrode and the drain of the N-channel transistor 74 are connected together and to the gate electrode of the P-channel transistor 76. Consequently, the N-channel transistor 74 provides a resistive path for applying a voltage potential having a value between ground and approximately one N-channel threshold voltage above ground to the gate electrode of the P-channel transistor 76. The source and the N-type substrate region of the P-channel transistor 76 are connected to VCC; hence, the P-channel transistor 76 is in a conductive state and, with the drain of the P-channel transistor 76 being connected to the gate of the N-channel transistor 78, provides a resistive path for applying a positive voltage potential of VCC to the gate of the N-channel transistor 78. The source and P-type substrate region of the N-channel transistor 78 are connected to ground. Thus, like the resistor 22 of FIG. 1, the N-channel transistor 78 provides a resistive path to ground for applying a ground-voltage potential to the gate electrode of the P-channel transistor 70 and to the gate electrode of the N-channel transistor 72.

Unlike the source and the P-type substrate region of the N-channel transistor 18 of FIG. 1, the source and the P-type substrate region of the N-channel transistor 72 are not connected directly to an input node but, instead, are connected to the gate electrode and to the drain of the N-channel transistor 80. The source and the P-type substrate region of the transistor 80 are connected together and, in a series fashion, are connected to the gate electrode and the drain of the N-channel transistor 82. The source and P-type substrate region of the N-channel transistor 82 are connected together and to an input node 84. Alternatively, the N-channel transistor 80 can be eliminated and the source and the P-type substrate region of the N-channel transistor 72 directly connected to the gate electrode and the drain of the N-channel transistor 82. As a further alternative, one or more additional N-channel transistors may be connected in series between the N-channel transistor 82 and the N-channel transistor 72 in the same manner as for the N-channel transistor 80.

When the input node 84 is at VCC or ground or any voltage between VCC and ground, the node 73 will be at VCC. By comparison to the input-voltage detector circuit of FIG. 1, each additional N-channel enhancement-mode transistor connected between the source of the N-channel transistor 72 and the input node 84 necessitates that the voltage applied to the input node 84 be negative by approximately an additional N-channel threshold voltage in order to cause the node 73 to transistion from VCC to a voltage near or more negative than ground. Thus, the negative input voltage which will cause a transistion of the output of the input stage can be predetermined by appropriately selecting the number of N-channel enhancement-mode transistors to be connected in series at the input of the input-voltage detector circuit.

In the embodiment illustrated in FIG. 2, a buffer stage 86 is comprised of an N-channel transistor 88, an N-channel transistor 90, a P-channel transistor 92, and a P-channel transistor 94. The N-channel transistor 88, the P-channel transistor 92, and the P-channel transistor 94 are each designed to have a width/length ratio of 5/10. The width/length ratio of the N-channel transistor 90 is designed to be 25/10. Thus, the N-channel transistor 90 is relatively large by comparison to the other transistors of the buffer stage 86. The drain of the N-channel transistor 88 is connected to the source of the P-channel transistor 94 and to the drain of the P-channel transistor 92 to form a node 96. The drain of the N-channel transistor 90 is connected to the drain of the P-channel transistor 94 and to an output node 98.

When the node 73 is at VCC, each of the N-channel transistors 88 and 90 is in a conductive state whereas each of the P-channel transistors 92 and 94 is in a nonconductive state. Consequently, the node 96 and the output node 98 are at or near ground.

When the node 73 is caused to transition, however, to a voltage more negative than one N-channel threshold voltage above ground, the N-channel transistors 88 and 90 become non-conductive, allowing the node 96 and the output node 98 to be charged to a voltage at or near VCC through the P-channel transistors 92 and 94. The P-channel transistor 94 does not become conductive until the node 96 is charged through the P-channel transistor 92 to a voltage that is more positive by one P-channel threshold voltage than the voltage on the node 73. For this reason and because the N-channel transistor 90 has a relatively large width/length ratio, the output node 98 does not transition to a logic 1 state until the node 73 has transitioned almost to ground. Thus, by comparison to the buffer stage 42 illustrated in FIG. 1, the buffer stage 86 has a greater noise margin.

Referring now to FIG. 3, an alternative embodiment of an input-voltage detector circuit according to the invention is indicated generally by the reference numeral 100. The circuit 100 is a complementary embodiment of the circuit 10 of FIG. 1, plus an additional P-channel transistor 102 connected in series with an input node 104. In addition to the transistor 102, the circuit 100 is comprised of a P-channel transistor 106, an N-channel transistor 108, a resistor 110, a P-channel transistor 112, and an N-channel transistor 114. The drain of the P-channel transistor 106 is connected to the drain of the N-channel transistor 108 and to a node 116 which is further connected to the gate electrode of the P-channel transistor 112 and to the gate electrode of the N-channel transistor 114. The drain of the P-channel transistor 112 is connected to the drain of the N-channel transistor 114 and to an output node 118. In the preferred embodiment, all transistors are of the enhancement-mode type and each has a threshold voltage of approximately 1.0 volt.

By comparison to the embodiments illustrated in FIG. 1 and FIG. 2, all voltage polarities for the circuit 100 are reversed. That is, the power supply voltage, designated as VDD, is typically at a negative five volts with respect to ground, and the input 104 normally operates at input voltages between ground and VDD. Under such conditions, the node 116 will be at a voltage of VDD and the output 118 will be at ground. If, however, a sufficiently positive voltage is applied to the input node 104, the P-channel transistors 102 and 106 are caused to become conductive. The node 116 then transitions to a voltage near or more positive than ground causing the output node 118 to transition to VDD, thereby indicating that an unusual voltage condition has been applied to the input node 104.

Although preferred embodiments of the invention have been described in detail, it should be apparent that various changes, substitutions and alterations can be made therein without departing from the spirit and scope of the inventions as defined by the claims.

What is claimed is:

1. In a CMOS monlithic integrated circuit, an input-voltage detector circuit for increasing the functionality of said integrated circuit without requiring an increase in the number of terminals of said integrated circuit, or, alternatively, for reducing the number of required terminals, said input-voltage detector circuit having a ground node, a positive-voltage power supply node, an output node, and an input node for receiving an input voltage which is more positive than ground by a first predetermined level for a logic 1 input, for receiving an input voltage approximately at ground-voltage potential for a logic 0 input, and for receiving an input voltage which is more negative than ground by a second predetermined level for an alternative-function input signal, comprising:

a. an N-channel enhancement-mode transistor having both its source and P-type substrate region electrically coupled to said input node;

b. an electrically conductive load element coupled between the drain of said N-channel enhancement-mode transistor and said positive-voltage power supply node;

c. means for applying a ground-voltage potential to the gate electrode of said N-channel enhancement-mode transistor;

d. a buffer stage having an input coupled to the drain of said N-channel enhancement-mode transistor and having an output coupled to said output node of said input-voltage detector circuit, said buffer stage generating one binary logic state at its output when a voltage potential near or more negative than ground is applied to its input, and said buffer stage generating the opposite binary logic state at its output when a voltage potential near that of said positive-voltage power supply node is applied to its input;

whereby the input-voltage detector circuit detects when a voltage more negative than ground by said second predetermined level is applied to said input node of said input-voltage detector circuit.

2. In a CMOS monolithic integrated circuit, an input-voltage detector circuit for increasing the functionality of said integrated circuit without requiring an increase in the number of terminals of said integrated circuit, or, alternatively, for reducing the number of required terminals, said input-voltage detector circuit having a ground node, a positive-voltage power supply node, an output node, and an input node for receiving an input voltage which is more positive than ground by a first predetermined level for a logic 1 input, for receiving an input voltage approximately at ground-voltage potential for a logic 0 input, and for receiving an input voltage which is more negative than ground by a second predetermined level for an alternative-function input signal, comprising:

a. an N-channel enhancement-mode transistor having both its source and P-type substrate region electrically coupled to said input node;

b. a P-channel transistor having its drain electrically coupled to the drain of said N-channel enhancement-mode transistor, said P-channel transistor having both its source and N-type substrate region electrically coupled to said positive-voltage power supply node;

c. means for applying a ground-voltage potential to both the gate electrode of said N-channel enhancement-mode transistor and to the gate electrode of said P-channel transistor;

d. a buffer stage having an input coupled to the drain of said N-channel enhancement-mode transistor and to the drain of said P-channel transistor, said buffer stage having an output coupled to said output node of said input-voltage detector circuit, said buffer stage generating one binary logic state at its output when a voltage potential near or more negative than ground is applied to its input, and said buffer stage generating the opposite binary logic state at its output when a voltage potential near that of said positive-voltage power supply node is applied to its input;

whereby the input-voltage detector circuit detects when a voltage more negative than ground by said first predetermined level is applied to said input node of said input-voltage detector circuit.

3. The input-voltage detector circuit of claim 1 further including a first means coupled between said input node and the source of said N-channel enhancement-mode transistor for substantially inhibiting any current flowing between the source of said N-channel enhancement-mode transistor and said input node until the voltage differential between said input node and the source of said N-channel enhancement-mode transistor is greater than a third predetermined level.

4. The input-voltage detector circuit of claim 2 further including a first means coupled between said input node and the source of said N-channel enhancement-mode transistor for substantially inhibiting any current flowing between the source of said N-channel enhancement-mode transistor and said input node until the voltage differential between said input node and the source of said N-channel enhancement-mode transistor is greater than a third predetermined level.

5. In a CMOS monolithic integrated circuit, an input-voltage detector circuit for increasing the functionality if said integrated circuit without requiring an increase in the number of terminals of said integrated circuit, or, alternatively, for reducing the number of required terminals, said input-voltage detector circuit having a ground node, a negative-voltage power supply node, an output node, and an input node for receiving an input voltage which is more negative than ground by a first predetermined level for a logic 1 input, for receiving an input voltage approximately at ground-voltage potential for a logic 0 input, and for receiving an input voltage which is more positive than ground by a second predetermined level for an alternative-function input signal, comprising:

a. a P-channel enhancement-mode transistor having both its source and P-type substrate region electrically coupled to said input node;
 b. an N-channel transistor having its source electrically coupled to the source of said P-channel enhancement-mode transistor, said N-channel transistor havinb both its drain and P-type substrate region electrically coupled to said negative-voltage power supply node;
 c. means for applying a ground-voltage potential to both the gate electrode of said P-channel enhancement-mode transistor and to the gate electrode of said N-channel transistor;
 d. a buffer stage having an input coupled to the drain of said P-channel enhancement-mode transistor and having an output coupled to said output node of said input-voltage detector circuit, said buffer stage generating one binary logic state at its output when a voltage potential near or more negative than ground is applied to its input, and said buffer stage generating the opposite binary logic state at its output when a voltage potential near that of said negative-voltage power supply node is applied to its input;

whereby the input-voltage detector circuit defects when a voltage more positive than ground by said second predetermined level is applied to said input node of said input-voltage detector circuit.

6. The input-voltage detector circuit of claim 5 further including a first means coupled between said input node and the sourrce of said P-channel enhancement-mode transistor for substantially inhibiting any current flowing between the source of said P-channel enhancement-mode transistor and said input node until the voltage differential between said input node and the source of said P-channel enhancement-mode transistor is greater than a third predetermined level.

7. The input-voltage detector circuit of claim 3 wherein said first means comprises a plurality of N-channel transistors connected in series such that the source and substrate of a first of said plurality of N-channel transistors is connected to said imnput node and the source and substrate of a second of said plurality of N-channel transistors is connected to the drain and gate of said first of said plurality of N-channel transistors, and the drain and gate of a last of said plurality of N-channel transistors is connedcted to the source and substrate of said N-channel enhancement-mode transistor.

8. The input-voltage detector circuit of claim 4 wherein said first means comprises a plurality of N-channel transistors connected in series such that the source and substrate of a first of said plurality of N-channel transistors is connected to said input node and the source and substrate of a second of said plurality of N-channel transistors is connected to the drain and gate of said first of said plurality of N-channel transistors, and the drain and gate of a last of said plurality of N-channel transistors is connected to the source and substrate of said N-channel enhancement-mode transistor.

9. The input-voltage detector circuit of claim 6 wherein said first means comprises a plurality of P-channel transistors connected in series such that the source and substrate of a first of said plurality of P-channel transistors is connected to said input node and the source and substrate of a second of said plurality of P-channel transistors is connected to the drain and gate of said first of said plurality of P-channel transistors, and the drain and gate of a last of said plurality of P-channel transistors is connected to the source and substrate of said P-channel enhancement-mode transistor.

10. In a CMOS monolithic integrated circuit, an input-voltage detector circuit for increasing the functionality of said integrated circuit without requiring an increase in the number of terminals of said integrated circuit, or, alternatively, for reducing the number of required terminals, said input-voltage detector circuit having a ground node, a positive-voltage power supply node, an output node, and an input node for receiving an input voltage which is more positive than ground by a first predetermined level for a logic 1 input, for receiving an input voltage approximately at ground-voltage potential for a logic 0 inut, and for receiving an input voltage which is more negative than ground by a second predetermined level for an alternative-function input signal, comprising:

a. a first N-channel enhancement-mode transistor;
 b. a plurality of N-channel transistors connected i series such that the source and substrate of a first of said plurality of N-channel transistors is connected to said input node and the soure and substrate of a second of said plurality of N-channel transistors is connected to the drain and gate of said first of said plurality of N-channel transistors, and the drain and gate of at last of said plurality of N-channel transistors is connected to the source and substrate of said first N-channel enhancement-mode transistor.

c. a first P-channel transistor having its drain electrically coupled to the drain of said first N-channel enhancement-mode transistor, said first P-channel transistor having both its source and N-type substrate region electrically coupled to said positive-voltage power supply node;

d. a second N-channel enhancement-mode transistor having its drain coupled to the gates of said first N-channel enhancement-mode transistor and said first P-channel transistor, the source and substrate of said second N-channel enhancement mode transistor being connected to ground;

e. a second P-channel transistor having its source connected to the gate of said second N-channel enhancement-mode transistor and having its drain and substrate connected to said positive-voltage power supply node;

f. a third N-channel enhancement-mode transistor having its gate and drain connected to the gate of said second P-channel transistor and having its source and substrate connected to ground;

g. a buffer stage having an input coupled to the drain of said first N-channel enhancement-mode transistor and having an output coupled to said outut node of said input-voltage detector circuit, said buffer stage generating one binary logic state at its output when a voltage potential near or more negative than ground is applied to its input, and said buffer stage generating the opposite binary logic state at its output when a voltage potential near that of said positive-voltage power supply node is applied to its input;

whereby the input-voltgage detector circuit generates said opposite binary logic state at said output of said buffer stage when a voltage more negative than ground or a voltage more positive than ground by said first predetermined level is applied to said input node of said input-voltage detector circuit.

11. In a CMOS integrated circuit for receiving and processing voltage which are more positive than ground by a first predetermined level for a logic 1 input and which are approximately at ground-voltage potential for a logic 0 input, THE IMPROVEMENT COMPRISING: an input-voltage detector circuit for increasing the functionality of said integrated circuit without requiring an increase in the number of terminals of said integrated circuit, or, alternatively, for reducing the number of required terminals, and input-voltage detector circuit coupled to an input terminal of said integrated circuit and comprising:

a. an N-channel enhancement-mode transistor having both its source and P-type substrate region electrically coupled to said input node;

b. an electrically conductive load element ccoupled between the drain of said N-channel enhancement-mode transistor and said positive-voltage power supply node;

c. means for applying a ground-voltage potential to the gate electrode of said N-channel enhancement-mode transistor;

d. a buffer stage having an input coupled to the drain of said N-channel enhancement-mode transistor and having an output coupled to said output node of said input-voltage detector circuit, said buffer stage generating one binary logic state at its output when a voltage potential near or more negative than ground is applied to its input, and said buffer stage generating the opposite binary logic state at its output when a voltage potential near that of said positive-voltage power supply node is applied to its input;

whereby the input-voltage detector circuit detects when a voltage more negative than ground by a predetermined level is applied to said input node of said input-voltage detector circuit.

* * * * *